(12) United States Patent
Shiraishi et al.

(10) Patent No.: US 12,412,832 B2
(45) Date of Patent: Sep. 9, 2025

(54) SEMICONDUCTOR DEVICE

(71) Applicant: RENESAS ELECTRONICS CORPORATION, Tokyo (JP)

(72) Inventors: Nobuhito Shiraishi, Tokyo (JP); Yasuo Morimoto, Tokyo (JP); Yoshihiro Funato, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 426 days.

(21) Appl. No.: 18/163,566

(22) Filed: Feb. 2, 2023

(65) Prior Publication Data

US 2023/0343700 A1 Oct. 26, 2023

(30) Foreign Application Priority Data

Apr. 21, 2022 (JP) ................................ 2022-069987

(51) Int. Cl.
*H01L 23/532* (2006.01)
*H01C 7/00* (2006.01)
(Continued)

(52) U.S. Cl.
CPC ...... *H01L 23/5228* (2013.01); *H01L 23/5329* (2013.01); *H01L 25/0655* (2013.01);
(Continued)

(58) Field of Classification Search
CPC .............. H01L 23/522; H01L 23/5226; H01L 23/5228; H01L 23/535; H01L 23/5227
See application file for complete search history.

(56) References Cited

U.S. PATENT DOCUMENTS 5,536,085 A * 7/1996 Li .................... H01S 5/4031
372/50.12
6,041,653 A * 3/2000 Ichikawa .............. G01P 15/125
73/514.32
(Continued)

FOREIGN PATENT DOCUMENTS

JP          S63-278361 A    11/1988
JP          2005-026721 A    1/2005
(Continued)

OTHER PUBLICATIONS

US 9,786,594 B2, 10/2017, Tokumitsu et al. (withdrawn)
Office Action issued in corresponding Japanese Patent Application No. 2022-069987, dated Apr. 22, 2025.

*Primary Examiner* — Mohsen Ahmadi
(74) *Attorney, Agent, or Firm* — Rimon P.C.

(57) ABSTRACT

A semiconductor device includes a plurality of resistive films arranged on an interlayer dielectric film. Each of the plurality of resistive films extends in a first direction in plan view. The plurality of resistive films are arranged spaced apart in a second direction orthogonal to the first direction in plan view. The plurality of resistive films are divided into a first group, a second group, and a third group. The first group is located between the second group and the third group in the second direction. A second width variation amount of each of the plurality of second resistive films belonging to the second group and a third width variation amount of each of the plurality of third resistive films belonging to the third group are larger than a first width variation amount of each of the plurality of first resistive films belonging to the first group.

10 Claims, 18 Drawing Sheets

(51) Int. Cl.
 *H01L 23/522* (2006.01)
 *H01L 25/065* (2023.01)
 *H10D 1/47* (2025.01)
 *H10D 86/85* (2025.01)
(52) U.S. Cl.
 CPC .................. *H01L 2924/142* (2013.01); *H01L 2924/14253* (2013.01)

(56) References Cited

U.S. PATENT DOCUMENTS

| | | | |
|---|---|---|---|
| 7,592,855 | B2 | 9/2009 | Kamatani |
| 7,646,207 | B2 * | 1/2010 | Lin .................... H01L 22/14 324/755.07 |
| 8,659,122 | B2 | 2/2014 | Matsumura |
| 9,070,618 | B2 | 6/2015 | Ohtake |
| 9,646,748 | B2 * | 5/2017 | Hozoi .................... H01C 7/00 |
| 2003/0000071 | A1 * | 1/2003 | Nagakura ............ G01F 23/36 29/610.1 |
| 2005/0280003 | A1 * | 12/2005 | Watanabe ............ G06F 3/045 257/72 |
| 2008/0284452 | A1 * | 11/2008 | Sakamoto ............ H01L 22/14 257/E21.531 |
| 2014/0151627 | A1 * | 6/2014 | Hong .................... H10N 70/821 257/4 |
| 2014/0204548 | A1 * | 7/2014 | Sekine ................ H10D 1/20 361/761 |
| 2015/0153885 | A1 * | 6/2015 | Endo .................... G01L 1/205 345/174 |
| 2015/0381122 | A1 * | 12/2015 | Musa .................... H01L 23/66 257/536 |
| 2018/0261664 | A1 * | 9/2018 | Dirnecker ............ H10D 1/474 |
| 2019/0139754 | A1 * | 5/2019 | Hsueh .................. H10D 84/403 |
| 2020/0303094 | A1 | 9/2020 | Chintarlapalli Reddy et al. |
| 2020/0303303 | A1 * | 9/2020 | Kim .................... H01L 23/4824 |

FOREIGN PATENT DOCUMENTS

| | | |
|---|---|---|
| JP | 2008-021726 A | 1/2008 |
| JP | 2011-155192 A | 8/2011 |
| JP | 2014-041882 A | 3/2014 |
| JP | 2020-065075 A | 4/2020 |

* cited by examiner

SEMICONDUCTOR DEVICE

CROSS-REFERENCE TO RELATED APPLICATIONS

The disclosure of Japanese Patent Application No. 2022-069987 filed on Apr. 21, 2022, including the specification, drawings and abstract is incorporated herein by reference in its entirety.

BACKGROUND

The present disclosure relates to a semiconductor device. There are disclosed techniques listed below.
[Patent Document 1] Japanese Unexamined Patent Application Publication No. 2011-155192

A semiconductor device described in Patent Document 1 includes an interlayer dielectric film and a plurality of resistive films. The plurality of resistive films are arranged on the interlayer dielectric film. Each of the plurality of resistive films extends along a first direction. The plurality of resistive films are arranged spaced apart along a second direction orthogonal to the first direction.

SUMMARY

A width of each of the plurality of resistive films is designed to be constant. However, it is difficult to keep the width of each of the plurality of resistive films constant, and when a circuit is used in which the widths of some of the plurality of resistive films do not fall within a predetermined range, the accuracy of the circuit decreases. Therefore, it is necessary to increase the number of the plurality of resistive films and use a resistive film having a width that does not fall within a predetermined range as a dummy resistive film that is not used in the circuit, which increases the chip area. Other objects and novel features will become apparent from the description of this specification and the accompanying drawings.

A semiconductor device of the present disclosure includes an interlayer dielectric film and a plurality of resistive films arranged on the interlayer dielectric film. Each of the plurality of resistive films extends in a first direction along an upper surface of the interlayer dielectric film in plan view. The plurality of resistive films are arranged spaced apart in a second direction along the upper surface of the interlayer dielectric film and orthogonal to the first direction in plan view. The plurality of resistive films are divided into a first group, a second group, and a third group. The first group is located between the second group and the third group in the second direction. A second width variation amount of each of a plurality of second resistive films belonging to the second group and a third width variation amount of each of a plurality of third resistive films belonging to the third group are greater than a first width variation amount of each of a plurality of first resistive films belonging to the first group. The first width variation amount is a difference between a reference width and a width of each of the plurality of first resistive films. The second width variation amount is a difference between the reference width and a width of each of the plurality of second resistive films. The third width variation amount is a difference between the reference width and a width of each of the plurality of third resistive films. The reference width is a width of one of the plurality of resistive films at the center in the second direction. The plurality of first resistive films are electrically connected with a first circuit group. At least part of the plurality of second resistive films and/or at least part of the plurality of third resistive films are electrically connected with a second circuit group different from the first circuit group.

According to the semiconductor device of the present disclosure, an increase in the chip area can be suppressed.

DETAILED DESCRIPTION

Figure 1:
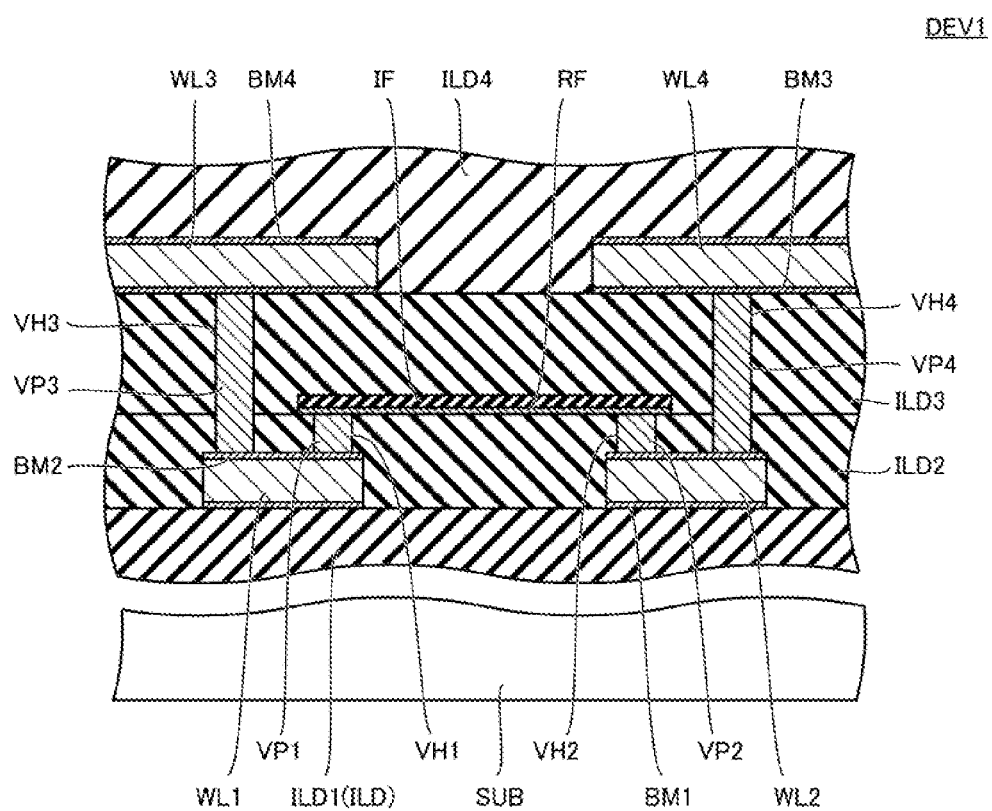
FIG. 1 is a cross-sectional view of a semiconductor device DEV1.

Details of embodiments of the present disclosure will be described with reference to the drawings. In the following drawings, the same or corresponding parts are denoted by the same reference numerals, and redundant description will not be repeated.

First Embodiment

A semiconductor device according to the first embodiment will be described. The semiconductor device according to the first embodiment is a semiconductor device DEV1.
Configuration of Semiconductor Device DEV1

The configuration of the semiconductor device DEV1 is described below.

Figure 2:
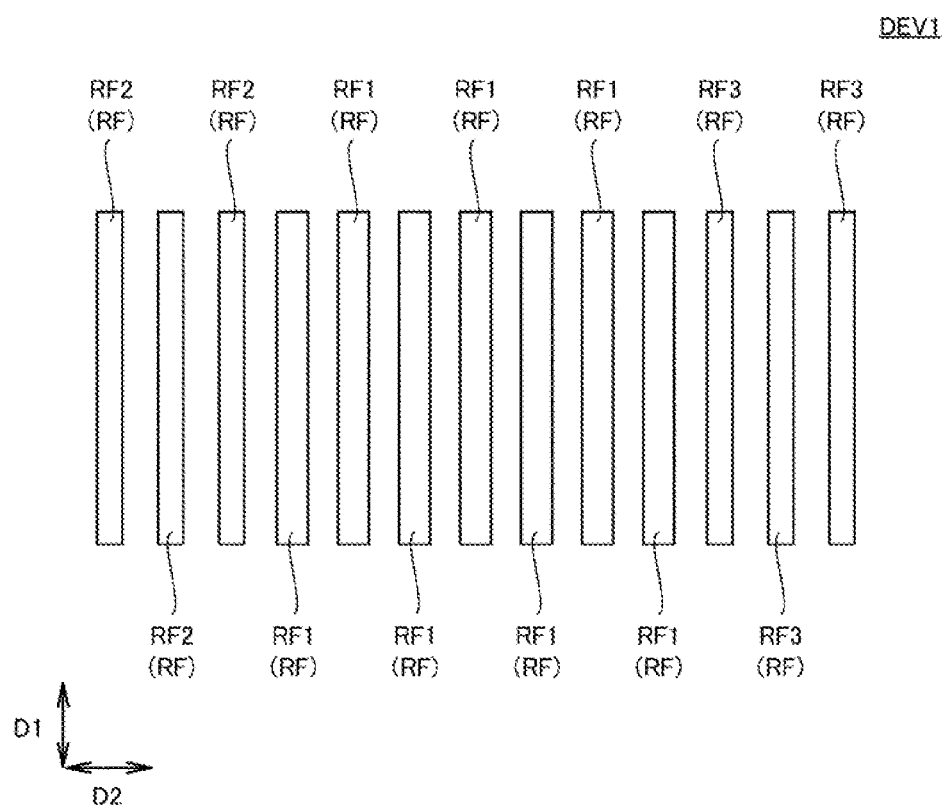
FIG. 2 is a plan view of a plurality of resistive films RF in the semiconductor device DEV1.

FIG. 1 is a cross-sectional view of the semiconductor device DEV1. FIG. 2 is a plan view of the resistive film RF in the semiconductor device DEV1. As shown in FIGS. 1 and 2, the semiconductor device DEV1 includes a semiconductor substrate SUB and a plurality of interlayer dielectric films ILD. The semiconductor substrate SUB is formed of, for example, monocrystalline silicon (Si). The plurality of interlayer dielectric films ILD are arranged on the semiconductor substrate SUB. Each of the plurality of interlayer dielectric films ILD is formed of, for example, silicon oxide ($SiO_2$). One of the plurality of interlayer dielectric films ILD is referred to as an interlayer dielectric film ILD1.

The semiconductor device DEV1 includes a wiring WL1 and a wiring WL2. The wiring WL1 and the wiring WL2 are arranged on the interlayer dielectric film ILD1. The wiring WL1 and the wiring WL2 are formed, for example, aluminum (Al) or an aluminum alloy. Between the wiring WL1 and the interlayer dielectric film ILD1 and between the wiring WL2 and the interlayer dielectric film ILD1, a barrier metal BM1 is arranged. A barrier metal BM2 is arranged on the wiring WL1 and the wiring WL2. The barrier metal BM1 and the barrier metal BM2 are each formed of, for example, a laminated film of a titanium nitride (TiN) film and a titanium (Ti) film.

Another one of the plurality of interlayer dielectric films ILD is referred to as an interlayer dielectric film ILD2. The interlayer dielectric film ILD2 is arranged on the interlayer dielectric film ILD1 so as to cover the wiring WL1 and the wiring WL2. A via hole VH1 and a via hole VH2 are formed in the interlayer dielectric film ILD2. The via hole VH1 and the via hole VH2 penetrate through the interlayer dielectric film ILD2 in a thickness direction. A part of the wiring WL1 and a part of the wiring WL2 are exposed at the bottom of the via hole VH1 and the bottom of the via hole VH2, respectively.

The semiconductor device DEV1 includes a via plug VP1 and a via plug VP2. The via plug VP1 and the via plug VP2 are buried in the via hole VH1 and the via hole VH2, respectively. The via plug VP1 and the via plug VP2 are formed of, for example, tungsten (W). The lower end of the via plug VP1 is electrically connected with the wiring WL1. The lower end of the via plug VP2 is electrically connected with the wiring WL2.

The semiconductor device DEV1 includes a plurality of resistive films RF. The resistive films RF are arranged on the interlayer dielectric film ILD2. The resistive film RF is formed of a conductive material. The resistive film RF is preferably formed of a material including at least one selected from the group consisting of silicon chromium (SiCr), carbon (C)-doped silicon chromium, nickel chromium (NiCr), titanium nitride, and tantalum nitride (TaN). However, the resistive film RF may be formed of other conductive materials (for example, polycrystalline silicon).

The resistive film RF is electrically connected with an upper end of the via plug VP1 and an upper end of the via plug VP2. Thus, the resistive film RF is electrically connected with the wiring WL1 and the wiring WL2. The semiconductor device DEV1 may include a plurality of dielectric films IF. The dielectric films IF are arranged on the resistive film RF. As described later, the dielectric film IF is a mask (hard mask) for patterning the resistive film RF. The dielectric film IF is formed of, for example, silicon oxide or silicon oxynitride (SiON).

Another one of the plurality of interlayer dielectric films ILD is referred to as an interlayer dielectric film ILD3. The interlayer dielectric film ILD3 is arranged on the interlayer dielectric film ILD2 so as to cover the plurality of resistive films RF and the plurality of dielectric films IF.

A via hole VH3 and a via hole VH4 are formed in the interlayer dielectric film ILD2 and the interlayer dielectric film ILD3. The via hole VH3 and the via hole VH4 penetrate through the interlayer dielectric film ILD2 and the interlayer dielectric film ILD3 along the thickness direction. A part of the wiring WL1 and a part of the wiring WL2 are exposed at the bottom of the via hole VH3 and the bottom of the via hole VH4, respectively.

The semiconductor device DEV1 includes a via plug VP3 and a via plug VP4. The via plug VP3 and the via plug VP4 are buried in the via hole VH3 and the via hole VH4, respectively. The via plug VP3 and the via plug VP4 are formed of, for example, tungsten. The lower end of the via plug VP3 is electrically connected with the wiring WL1, and the lower end of the via plug VP4 is electrically connected to the wiring WL2.

The semiconductor device DEV1 includes a wiring WL3 and a wiring WL4. The wiring WL3 and the wiring WL4 are arranged on the interlayer dielectric film ILD3. The wiring WL3 and the wiring WL4 are formed, for example, aluminum or an aluminum alloy. Between the wiring WL3 and the interlayer dielectric film ILD3 and between the wiring WL4 and the interlayer dielectric film ILD3, a barrier metal BM3 is arranged. A barrier metal BM4 is arranged on the wiring WL3 and the wiring WL4. The barrier metal BM3 and the barrier metal BM4 are formed of, for example, a laminated film of a titanium nitride film and a titanium film. The wiring WL3 and the wiring WL4 are electrically connected with an upper end of the via plug VP3 and an upper end of the via plug VP4, respectively. As a result, the wiring WL3 is electrically connected with the wiring WL1, and the wiring WL4 is electrically connected with the wiring WL2.

Another one of the plurality of interlayer dielectric films ILD is referred to as an interlayer dielectric film ILD4. The interlayer dielectric film ILD4 is arranged on the interlayer dielectric film ILD3 so as to cover the wiring WL3 and the wiring WL4. Although not shown, other wirings and other interlayer dielectric films may be sequentially laminated on the interlayer dielectric film ILD4.

Each of the plurality of resistive films RF extends in the first direction D1 along an upper surface of the interlayer dielectric film ILD2 in plan view. The plurality of resistive films RF are arranged spaced apart in the second direction D2 along the upper surface of the interlayer dielectric film ILD2. The second direction D2 is a direction orthogonal to the first direction D1.

The plurality of resistive films RF are divided into a first group, a second group, and a third group. The plurality of resistive films RF belonging to the first group are referred to as a plurality of resistive films RF1, the plurality of resistive films RF belonging to the second group are referred to as a plurality of resistive films RF2, and the plurality of resistive films RF belonging to the third group are referred to as a plurality of resistive films RF3. The second group is on one side of the first group in the second direction D2 (left side in the case of FIG. 2). That is, the first group is located between the second group and the third group in the second direction D2. The third group is on the other side of the first group in the second direction D2 (right side in the case of FIG. 2). The number of resistive films RF1 is greater than the number of resistive films RF2 and the number of resistive films RF3. The length of each of the plurality of resistive films RF are equal to each other, for example. Here, the length of the resistive film RF is the length of the resistive film RF in the first direction D1. Even if the lengths of the plurality of resistive films RF are different from each other due to manufacturing variations, it is included in a case that the length of each of the plurality of resistive films RF is equal to each other.

The width variation amount (second width variation amount) of each of the plurality of resistive films RF2 and the width variation amount (third width variation amount) of each of the plurality of resistive films RF3 are greater than the width variation amount (first width variation amount) of each of the plurality of resistive films RF1. The first width variation amount is a difference between the width of each of the plurality of resistive films RF1 and the reference width. The second width variation amount is a difference between the width of each of the plurality of resistive films RF2 and the reference width. The third width variation amount is a difference between the width of each of the plurality of resistive films RF3 and the reference width. The reference width is the width of the resistive film RF at the center in the second direction D2. When the number of the plurality of resistive films RF is an even number, the reference width is the width of one of the two resistive films RF at the center in the second direction D2. The first width variation amount of each of the plurality of resistive films RF1 is, for example, 0.5% or less of the reference width. The second width variation amount of each of the plurality of resistive films RF2 and the third width variation amount of each of the plurality of resistive films RF3 are each, for example, greater than 0.5% of the reference width. In the case of FIG. 2, the width of each of the plurality of resistive films RF2 and the width of each of the plurality of resistive films RF3 are smaller than the width of each of the plurality of resistive films RF1. Here, the width of the resistive film RF is the width of the resistive film RF in the second direction D2.

Figure 3:
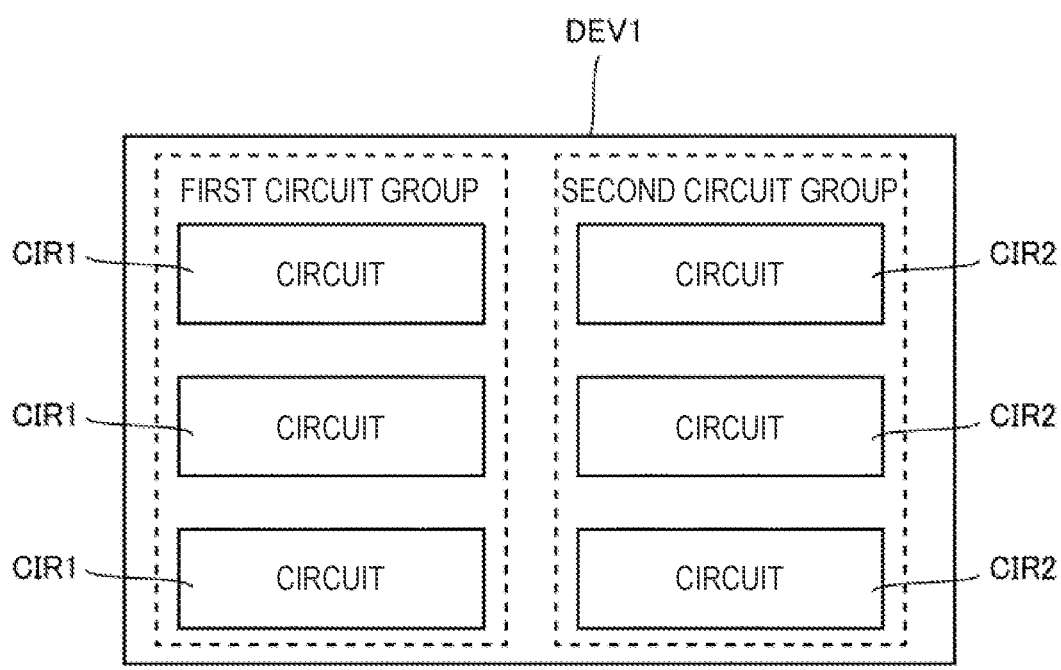
FIG. 3 is a schematic block diagram of the semiconductor device DEV1.

FIG. 3 is a schematic block diagram of the semiconductor device DEV1. As shown in FIG. 3, the semiconductor device DEV1 includes a plurality of circuits CIR1 and a plurality of circuits CIR2. The plurality of circuits CIR1 constitute a first circuit group. The plurality of circuits CIR2 constitute a second circuit group. The plurality of resistive films RF1 are electrically connected with the first circuit group. The plurality of resistive films RF2 and the plurality of resistive films RF3 are electrically connected with the second circuit group. The second circuit group is different from the first circuit group. Further, the plurality of resistive films RF2 may be electrically connected with the second circuit group, and the plurality of resistive films RF3 may be electrically connected with the third circuit group that differs from the first circuit group and the second circuit group.

Each of the plurality of circuits CIR1 is preferably at least one of an analog/digital converter circuit, a digital/analog converter circuit, a bandgap reference circuit, a high frequency circuit, and an amplifier circuit. Each of the plurality of circuits CIR2 is preferably at least one of a circuit in which calibration is performed and a circuit generating a voltage from a power supply voltage. That is, it is preferable that the second circuit group is a circuit group in which the accuracy of the required electric resistance value is lower than that of the first circuit group.

Manufacturing Method of Semiconductor Device DEV1

A manufacturing method of the semiconductor device DEV1 is described below.

Figure 4:
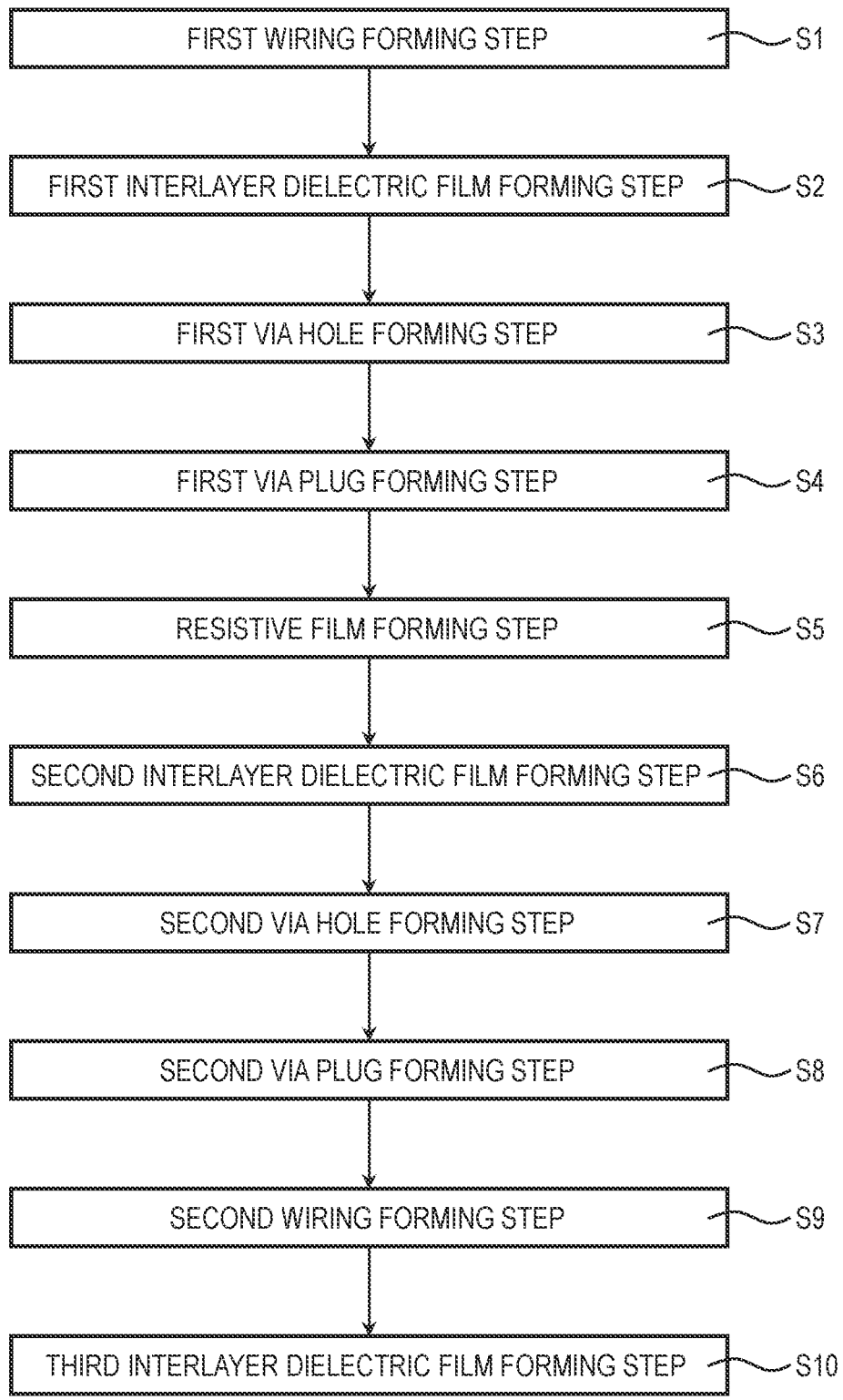
FIG. 4 is a manufacturing process diagram of the semiconductor device DEV1.

FIG. 4 is a manufacturing process diagram of the semiconductor device DEV1. As shown in FIG. 4, the manufacturing method of the semiconductor device DEV1 includes a first wiring forming step S1, a first interlayer dielectric film forming step S2, a first via hole forming step S3, a first via plug forming step S4, a resistive film forming step S5, a second interlayer dielectric film forming step S6, a second via hole forming step S7, a second via plug forming step S8, a second wiring forming step S9, and a third interlayer dielectric film forming step S10. Before performing the first wiring forming step S1, an interlayer dielectric film ILD1 and a lower layer structure are formed. These structures may be formed by a conventionally known method, and thus description thereof will be omitted here.

Figure 5:
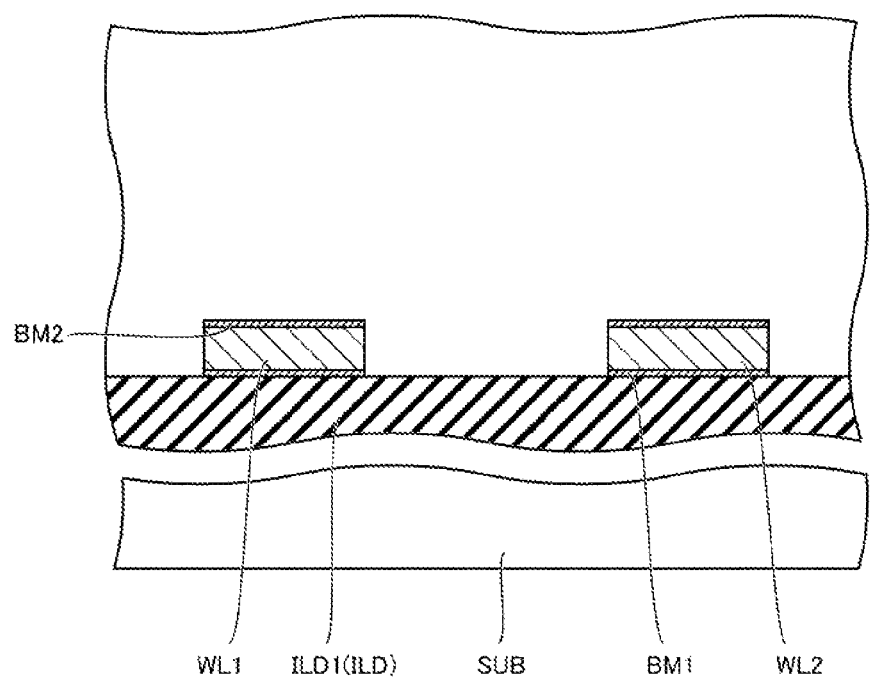
FIG. 5 is a cross-sectional view for explaining a first wiring forming step S1.

FIG. 5 is a cross-sectional view for explaining the first wiring forming step S1. As shown in FIG. 5, in the first wiring forming step S1, the wiring WL1, the wiring WL2, the barrier metal BM1, and the barrier metal BM2 are formed on the interlayer dielectric film ILD1. In the first wiring forming step S1, first, constituent materials of the barrier metal BM1, the wiring WL1 (wiring WL2), and the barrier metal BM2 are sequentially formed by, for example, a sputtering method. Second, a resist pattern is formed on the formed barrier metal BM2. The resist pattern is formed by exposing and developing the photoresist.

Third, the barrier metal BM1, the wiring WL1 (wiring WL2), and the barrier metal BM2 are etched using the resist pattern as a mask. Thus, the wiring WL1, the wiring WL2, the barrier metal BM1, and the barrier metal BM2 are formed. After the wiring WL1, the wiring WL2, the barrier metal BM1, and the barrier metal BM2 are formed, the resist pattern is removed.

Figure 6:
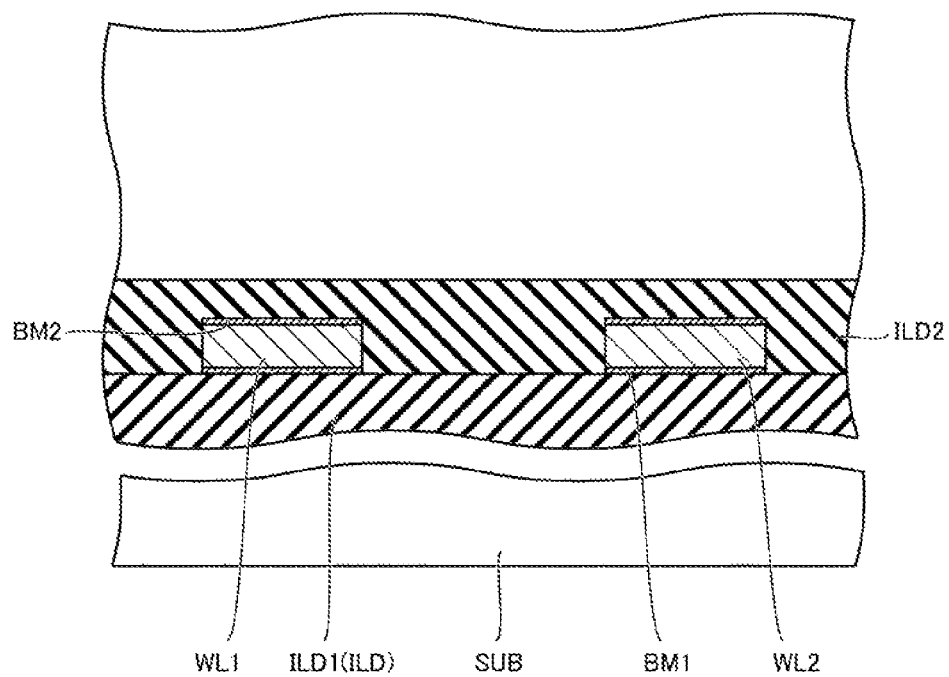
FIG. 6 is a cross-sectional view for explaining a first interlayer dielectric film forming step S2.

FIG. 6 is a cross-sectional view for explaining the first interlayer dielectric film forming step S2. In the first interlayer dielectric film forming step S2, as shown in FIG. 6, an interlayer dielectric film ILD2 is formed on the interlayer dielectric film ILD1 so as to cover the wiring WL1, the wiring WL2, the barrier metal BM1, and the barrier metal BM2. In the first interlayer dielectric film forming step S2, first, a constituent material of the interlayer dielectric film ILD2 is formed on the interlayer dielectric film ILD1 so as to cover the wiring WL1, the wiring WL2, the barrier metal BM1, and the barrier metal BM2 by, for example, a CVD (Chemical Vapor Deposition) method. Second, an upper surface of the formed interlayer dielectric film ILD2 is planarized by, for example, a CMP (Chemical Mechanical Polishing) method. As described above, the interlayer dielectric film ILD2 is formed.

Figure 7:
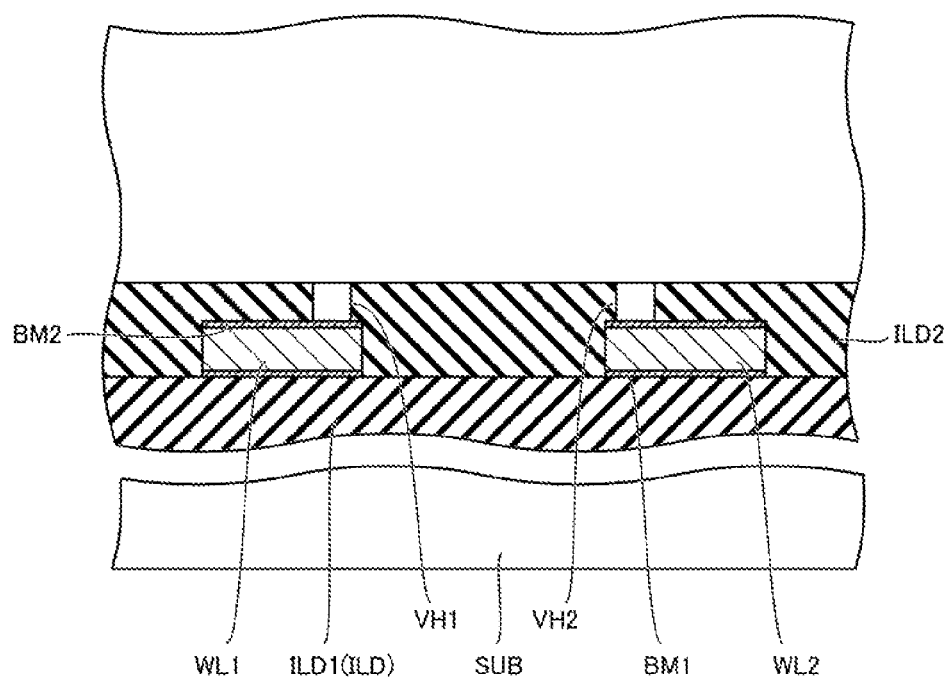
FIG. 7 is a cross-sectional view for explaining a first via hole forming step S3.

FIG. 7 is a cross-sectional view for explaining the first via hole forming step S3. In the first via hole forming step S3, as shown in FIG. 7, a via hole VH1 and a via hole VH2 are formed in the interlayer dielectric film ILD2. In the first via hole forming step S3, first, a resist pattern is formed on the interlayer dielectric film ILD2. The resist pattern is formed by exposing and developing the photoresist. Second, the interlayer dielectric film ILD2 is etched using the resist pattern as a mask. As described above, the via hole VH1 and the via hole VH2 are formed. After the via hole VH1 and the via hole VH2 are formed, the above-described resist pattern is removed.

Figure 8:
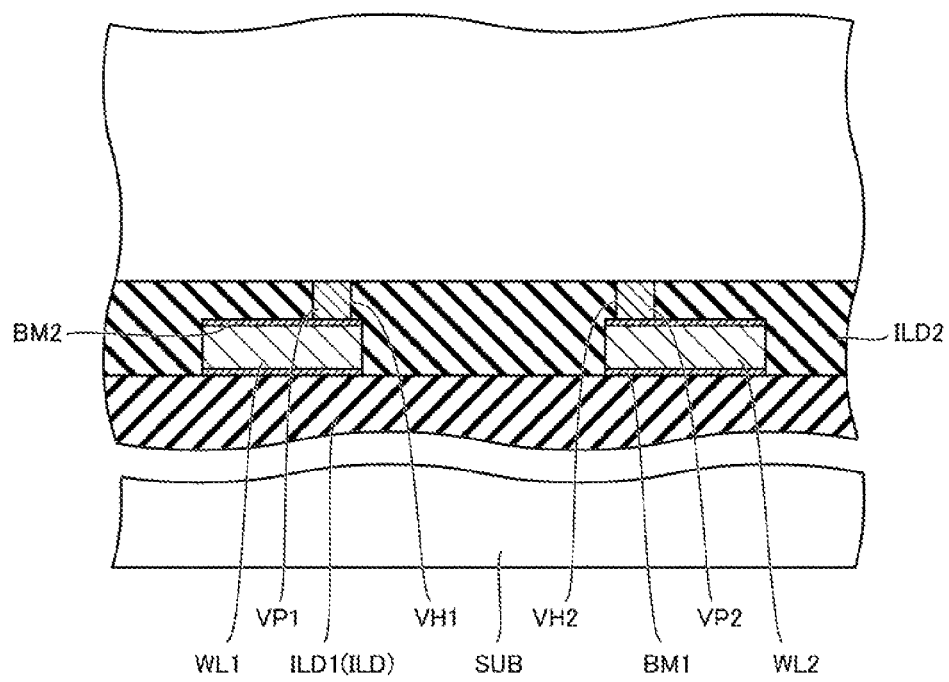
FIG. 8 is a cross-sectional view for explaining a first via plug forming step S4.

FIG. 8 is a cross-sectional view for explaining the first via plug forming step S4. In the first via plug forming step S4, as shown in FIG. 8, the via plug VP1 and the via plug VP2 are formed in the via hole VH1 and the via hole VH2. In the first via plug forming step S4, first, a constituent material of the via plug VP1 (via plug VP2) is buried in the via hole VH1 and the via hole VH2 by, for example, a CVD method. Second, the constituent material of the via plug VP1 (via plug VP2) protruding from the via hole VH1 and the via hole VH2 is removed by, for example, a CMP method. As a result of the above, the via plug VP1 and the via plug VP2 are formed.

Figure 9:
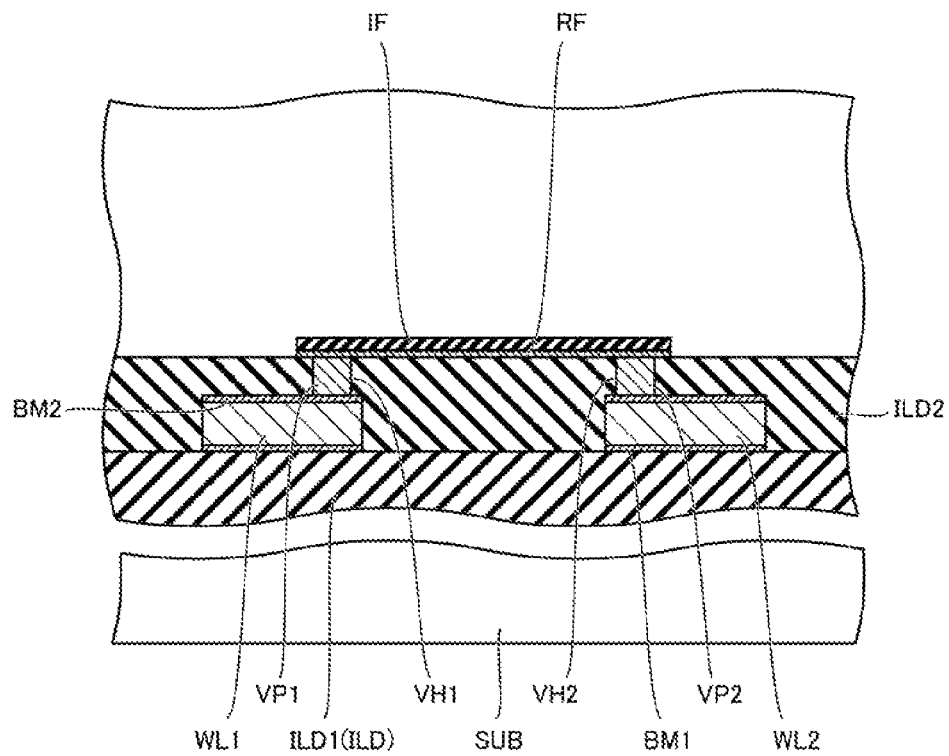
FIG. 9 is a cross-sectional view for explaining a resistive film forming step S5.

FIG. 9 is a cross-sectional view for explaining the resistive film forming step S5. As shown in FIG. 9, in the resistive film forming step S5, the resistive films RF and the dielectric film IF are formed on the interlayer dielectric film ILD2. In the resistive film forming step S5, first, a constituent material of the resistive film RF is formed on the interlayer dielectric film ILD2 by, for example, a sputtering method. Second, a constituent material of the dielectric film IF is formed on the formed constituent material of the resistive film RF. Third, a resist pattern is formed on the formed constituent material of the dielectric film IF. The resist pattern is formed by exposing and developing the photoresist.

Fourth, the formed constituent material of the dielectric film IF is etched using the resist pattern as a mask. As a result, the dielectric film IF is formed. After the dielectric film IF is formed, the resist pattern is removed. Fifth, using the dielectric film IF as a mask (hard mask), the formed constituent material of the resistive film RF is etched. Thus, the resistive films RF are formed. After the resistive films RF are formed, the dielectric film IF is not removed.

Figure 10:
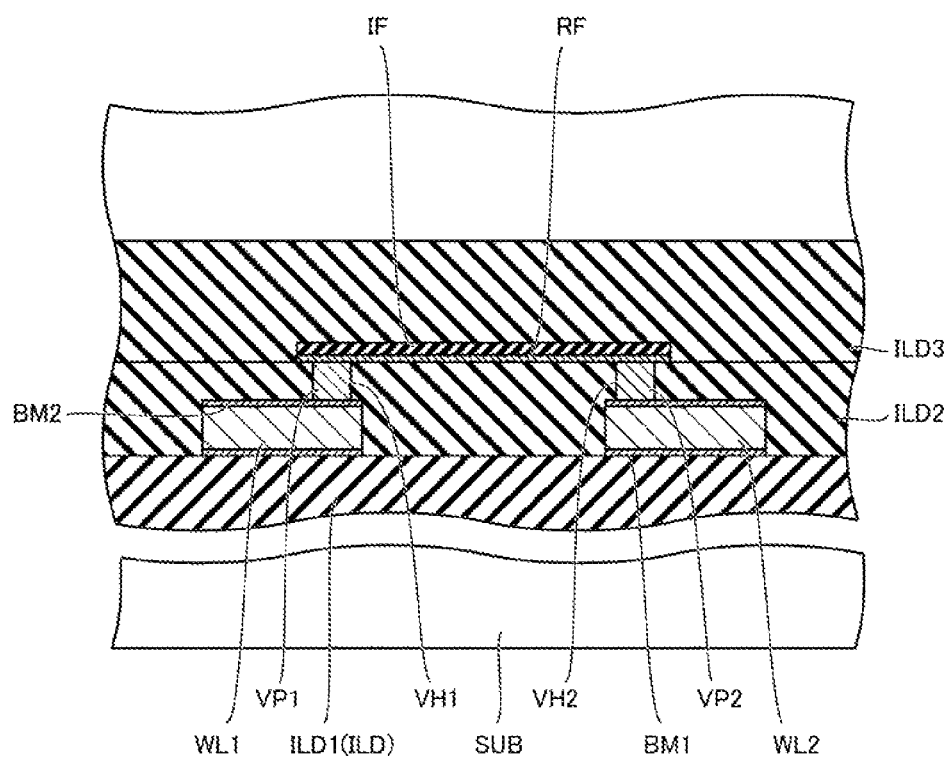
FIG. 10 is a cross-sectional view for explaining a second interlayer dielectric film forming step S6.

FIG. 10 is a cross-sectional view for explaining the second interlayer dielectric film forming step S6. In the second interlayer dielectric film forming step S6, as shown in FIG. 10, the interlayer dielectric film ILD3 is formed on the interlayer dielectric film ILD2 so as to cover the resistive films RF. In the second interlayer dielectric film forming step S6, first, a constituent material of the interlayer dielectric film ILD3 is formed on the interlayer dielectric film ILD2 so as to cover the resistive film RF by, for example, a CVD method. Second, an upper surface of the formed constituent material of the interlayer dielectric film ILD3 is planarized by, for example, a CMP method. As described above, the interlayer dielectric film ILD3 is formed.

Figure 11:
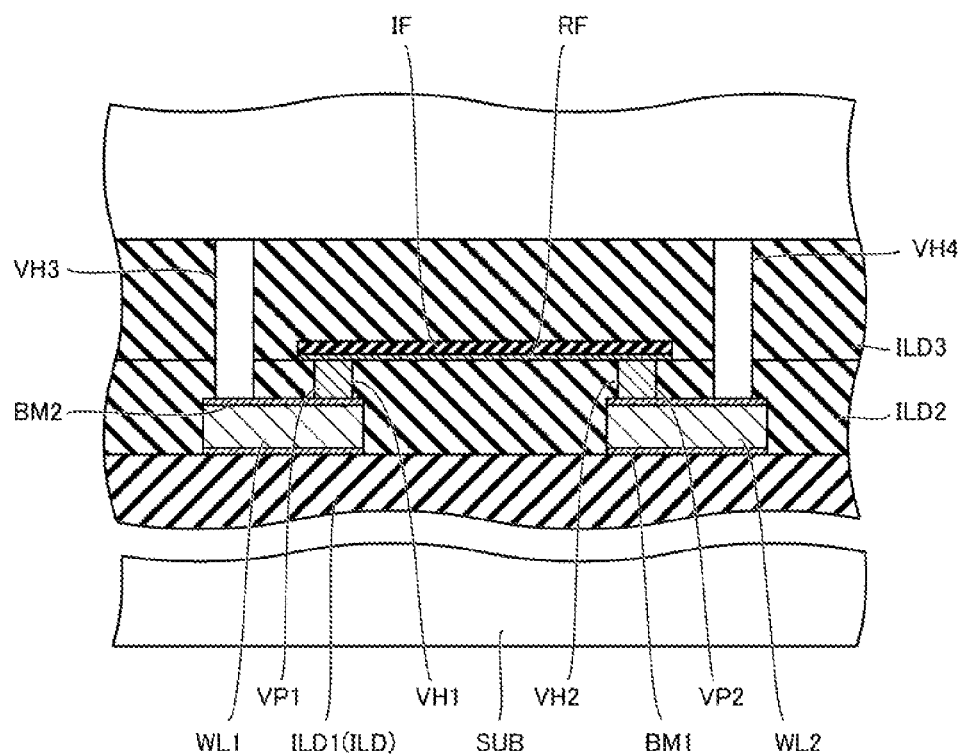
FIG. 11 is a cross-sectional view for explaining a second via hole forming step S7.

FIG. 11 is a cross-sectional view for explaining the second via hole forming step S7. In the second via hole forming step S7, as shown in FIG. 11, a via hole VH3 and a via hole VH4 are formed in the interlayer dielectric film ILD2 and the interlayer dielectric film ILD3.

First, in the second via hole forming step S7, a resist pattern is formed on the interlayer dielectric film ILD3. The resist pattern is formed by exposing and developing the photoresist. Second, the interlayer dielectric film ILD2 and the interlayer dielectric film ILD3 are etched using the resist pattern as a mask. As described above, the via hole VH3 and the via hole VH4 are formed. After the via hole VH3 and the via hole VH4 are formed, the above-described resist pattern is removed.

Figure 12:
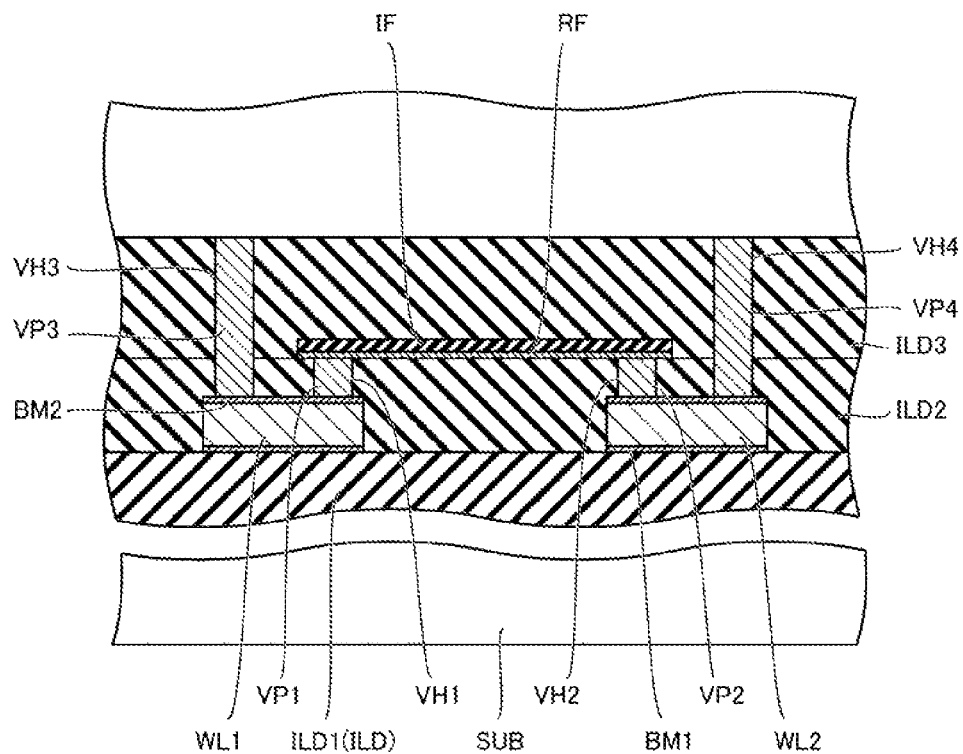
FIG. 12 is a cross-sectional view for explaining a second via plug forming step S8.

FIG. 12 is a cross-sectional view for explaining the second via plug forming step S8. In the second via plug forming step S8, as shown in FIG. 12, a via plug VP3 and a via plug VP4 are formed in the via hole VH3 and the via hole VH4.

In the second via plug forming step S8, first, a constituent material of a via plug VP3 (via plug VP4) is buried in the via hole VH3 and the via hole VH4 by, for example, a CVD method. Second, the constituent material of the via plug VP3 (via plug VP4) protruding from the via hole VH3 and the via hole VH4 is removed by, for example, a CMP method. As a result of the above, the via plug VP3 and the via plug VP4 are formed.

Figure 13:
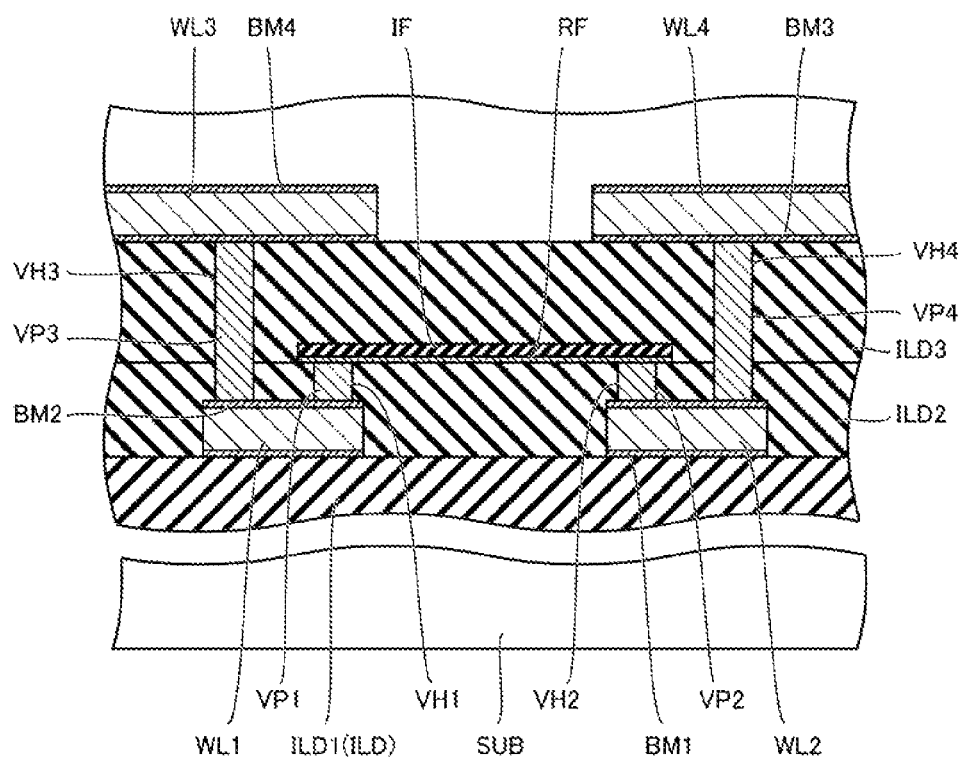
FIG. 13 is a cross-sectional view for explaining a second wiring forming step S9.

FIG. 13 is a cross-sectional view for explaining the second wiring forming step S9. As shown in FIG. 13, in the second wiring forming step S9, the wiring WL3, the wiring WL4, the barrier metal BM3, and the barrier metal BM4 are formed on the interlayer dielectric film ILD3. In the second wiring forming step S9, first, constituent materials of the barrier metal BM3, the wiring WL3 (wiring WL4), and the barrier metal BM4 are sequentially formed by, for example, a sputtering method. Second, a resist pattern is formed on the constituent material of the barrier metal BM4. The resist pattern is formed by exposing and developing the photoresist.

Third, the constituent materials of the barrier metal BM3, the wiring WL3 (wiring WL4), and the barrier metal BM4 are etched using the resist pattern as a mask. Thus, the wiring WL3, the wiring WL4, the barrier metal BM3, and the barrier metal BM4 are formed. The resist pattern is removed after the wiring WL3, the wiring WL4, the barrier metal BM3, and the barrier metal BM4 are formed.

In the third interlayer dielectric film forming step S10, the interlayer dielectric film ILD4 is formed on the interlayer dielectric film ILD3 so as to cover the wiring WL3, the wiring WL4, the barrier metal BM3, and the barrier metal BM4. In the third interlayer dielectric film forming step S10, first, a constituent material of the interlayer dielectric film ILD4 is formed on the interlayer dielectric film ILD3 so as to cover the wiring WL3, the wiring WL4, the barrier metal BM3, and the barrier metal BM4 by, for example, a CVD method. Second, an upper surface of the formed constituent material of the interlayer dielectric film ILD4 is planarized by, for example, a CMP method. Thus, the semiconductor device DEV1 having the structure shown in FIG. 1 is formed. After the third interlayer dielectric film forming step S10 is performed, other wirings, other interlayer dielectric films, and the like are sequentially laminated on the interlayer dielectric film ILD4. These structures may be formed by a conventionally known method, and thus description thereof will be omitted here.

Effects of Semiconductor Device DEV1

The effects of the semiconductor device DEV1 are described below.

In the semiconductor device DEV1, the width of each of the plurality of resistive films RF2 and the width of each of the plurality of resistive films RF3 may be smaller than the designed width due to the microloading effect when etching in the resistive film forming step S5 is performed, even if the width of each of the plurality of resistive films RF is designed to be constant.

When the plurality of resistive films RF2 and the plurality of resistive films RF3 are electrically connected with the first circuit group requiring the accuracy of the resistance value, the accuracy of the circuits included in the first circuit group is decreased. On the other hand, in some cases, the plurality of resistive films RF2 and the plurality of resistive films RF3 are formed as dummy resistive films that are not electrically connected with the circuit, and another plurality of resistive films that are electrically connected with the second circuit group are formed. In this case, although it is possible to suppress a decrease in the accuracy of the circuits included in the first circuit group, another resistive film electrically connected with the second circuit group is additionally formed, which increases the chip area.

In the semiconductor device DEV1, since the plurality of resistive films RF1 are electrically connected with the first circuit group, and the plurality of resistive films RF2 and the plurality of resistive films RF3 are electrically connected with the second circuit group, it is possible to suppress an increase in the chip area while suppressing a decrease in accuracy of the circuits included in the first circuit group. The present embodiment is not limited to cases where a plurality of resistive films RF are electrically connected with the first circuit group and the second circuit group. The plurality of resistive films RF may be electrically connected with three or more circuit groups. For example, the plurality of resistive films RF1 may be electrically connected with the first circuit group, the plurality of resistive films RF2 may be electrically connected with the second circuit group, and the plurality of resistive films RF3 may be electrically connected with the third circuit group. In this case, a plurality of resistive films RF can be used for more circuits while suppressing an increase in chip size.

Second Embodiment

A semiconductor device according to the second embodiment will be described. The semiconductor device according to the second embodiment is a semiconductor device DEV2. Here, differences from the semiconductor device DEV1 will be mainly described, and redundant description will not be repeated.

The semiconductor device DEV2 includes a semiconductor substrate SUB, an interlayer dielectric film ILD1, an interlayer dielectric film ILD2, an interlayer dielectric film ILD3, an interlayer dielectric film ILD4, a wiring WL1, a wiring WL2, a wiring WL3, a wiring WL4, a plurality of resistive films RF1, a plurality of resistive films RF2, a plurality of resistive films RF3, a via plug VP1, a via plug VP2, a via plug VP3, and a via plug VP4. In the semiconductor device DEV2, the plurality of resistive films RF1 are electrically connected with the first circuit group, and the plurality of resistive films RF2 and the plurality of resistive films RF3 are electrically connected with the second circuit group. In these respects, the configuration of the semiconductor device DEV2 is the same as that of the semiconductor device DEV1.

Figure 14:
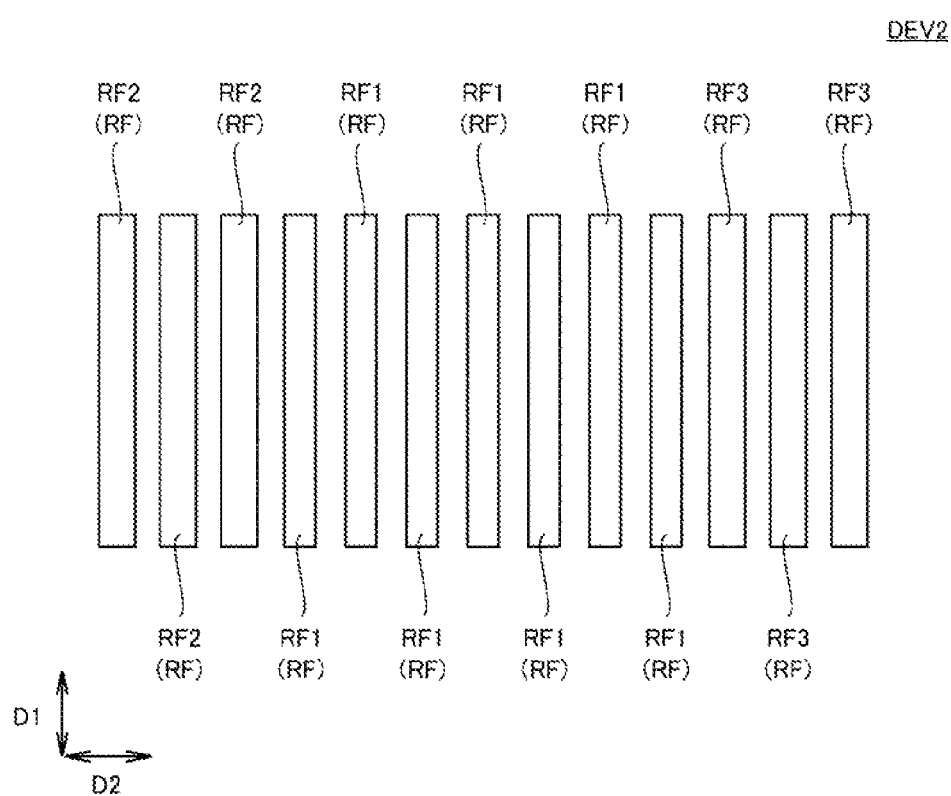
FIG. 14 is a plan view of the resistive film RF in a semiconductor device DEV2.

FIG. 14 is a plan view of the resistive film RF in the semiconductor device DEV2. As shown in FIG. 14, in the semiconductor device DEV2, a width of each of the plurality of resistive films RF2 and a width of each of the plurality of resistive films RF3 are larger than a width of each of the plurality of resistive films RF1. In this regard, the configuration of the semiconductor device DEV2 is different from the configuration of the semiconductor device DEV1.

Even in the semiconductor device DEV2, since the plurality of resistive films RF1 are electrically connected with the first circuit group, and the plurality of resistive films RF2 and the plurality of resistive films RF3 are electrically connected with the second circuit group, it is possible to suppress an increase in the chip area while suppressing a decrease in the accuracy of the circuits included in the first circuit group as in the semiconductor device DEV1.

Third Embodiment

A semiconductor device according to the third embodiment will be described. The semiconductor device according to the third embodiment is a semiconductor device DEV3. Here, differences from the semiconductor device DEV1 will be mainly described, and redundant description will not be repeated.

The semiconductor device DEV3 includes a semiconductor substrate SUB, an interlayer dielectric film ILD1, an interlayer dielectric film ILD2, an interlayer dielectric film ILD3, an interlayer dielectric film ILD4, a wiring WL1, a wiring WL2, a wiring WL3, a wiring WL4, a plurality of resistive films RF1, a plurality of resistive films RF2, a plurality of resistive films RF3, a via plug VP1, a via plug VP2, a via plug VP3, and a via plug VP4. In the semiconductor device DEV3, the plurality of resistive films RF1 are electrically connected with the first circuit group, and the plurality of resistive films RF2 and the plurality of resistive films RF3 are electrically connected with the second circuit group. In these respects, the configuration of the semiconductor device DEV3 is the same as that of the semiconductor device DEV1.

Figure 15:
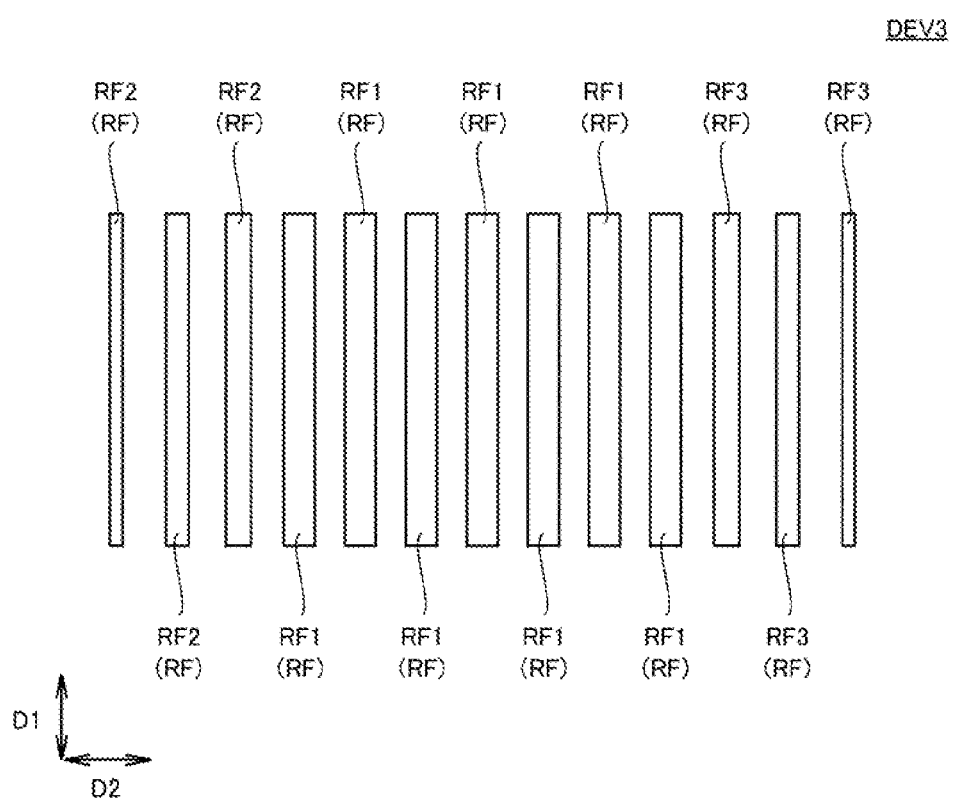
FIG. 15 is a plan view of the resistive film RF in a semiconductor device DEV3.

FIG. 15 is a plan view of the resistive film RF in the semiconductor device DEV3. As shown in FIG. 15, in the semiconductor device DEV3, each of the plurality of resistive films RF2 is smaller in width as it is located on one side (the left side in FIG. 15) in the second direction D2. That is, the width of each of the plurality of resistive films RF2 is smaller as a distance from the first group (the plurality of resistive films RF1) is larger in the second direction D2. In addition, in the semiconductor device DEV3, the difference between the widths of two next to each other among the plurality of resistive films RF2 is larger toward one side in the second direction D2. That is, the difference between the widths of two next to each other among the plurality of resistive films RF2 is larger as the distance from the first group is larger in the second direction D2. Similarly, each of the plurality of resistive films RF3 is smaller in width as it is located on the other side (the right side in the case of FIG. 15) in the second direction D2, and the difference between the widths of two next to each other among the plurality of resistive films RF3 is larger toward the other side in the second direction D2. That is, the width of each of the plurality of resistive films RF3 is smaller as a distance from the first group is larger in the second direction D2, and the difference between the widths of two next to each other among the plurality of resistive films RF3 is larger as the distance from the first group is larger. From another point of view, the width of each of the plurality of resistive films RF2 changes exponentially as the distance from the first group is larger in the second direction D2, and the width of each of the plurality of resistive films RF3 changes exponentially as the distance from the first group is larger in the second direction D2.

In the semiconductor device DEV3, the second circuit group includes an image processing circuit, and the plurality of resistive films RF2 and the plurality of resistive films RF3 are electrically connected with the image processing circuit. The plurality of resistive films RF2 and the plurality of resistive films RF3 that change in width as described above can be suitably used in the image processing circuit.

Even in the semiconductor device DEV3, since the plurality of resistive films RF1 are electrically connected with the first circuit group, and the plurality of resistive films RF2 and the plurality of resistive films RF3 are electrically connected with the second circuit group, it is possible to suppress an increase in the chip area while suppressing a decrease in the accuracy of the circuits included in the first circuit group as in the semiconductor device DEV1.

Fourth Embodiment

A semiconductor device according to the fourth embodiment will be described. The semiconductor device according to the fourth embodiment is a semiconductor device DEV4. Here, differences from the semiconductor device DEV1 will be mainly described, and redundant description will not be repeated.

The semiconductor device DEV4 includes a semiconductor substrate SUB, an interlayer dielectric film ILD1, an interlayer dielectric film ILD2, an interlayer dielectric film ILD3, an interlayer dielectric film ILD4, a wiring WL1, a wiring WL2, a wiring WL3, a wiring WL4, a plurality of resistive films RF1, a plurality of resistive films RF2, a plurality of resistive films RF3, a via plug VP1, a via plug VP2, a via plug VP3, and a via plug VP4. In the semiconductor device DEV4, the plurality of resistive films RF1 are electrically connected with the first circuit group. In these respects, the configuration of the semiconductor device DEV4 is the same as that of the semiconductor device DEV1.

Figure 16:
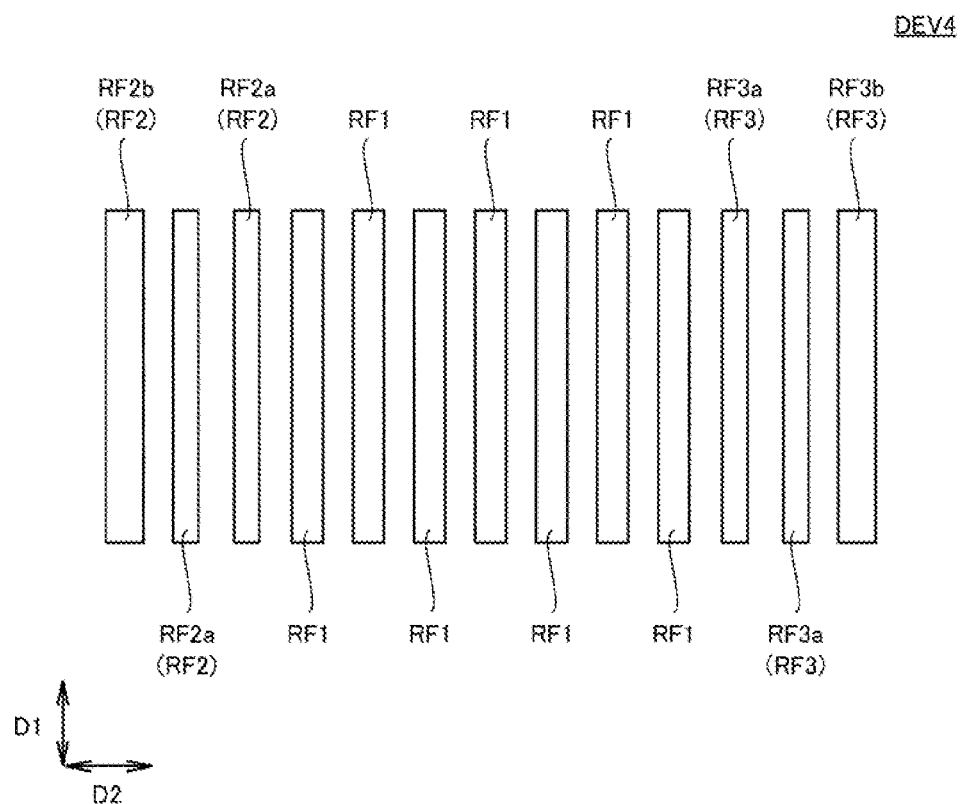
FIG. 16 is a plan view of the resistive film RF in a semiconductor device DEV4.

FIG. 16 is a plan view of the resistive film RF in the semiconductor device DEV4. As shown in FIG. 16, in the semiconductor device DEV4, a part of the plurality of resistive films RF2 forms a fourth group, and the other part of the plurality of resistive films RF2 forms a fifth group. The plurality of resistive films RF2 belonging to the fourth group are referred to as a plurality of resistive films RF2a. The resistive film RF2 belonging to the fifth group is referred to as a resistive film RF2b. The resistive film RF2b is located on one side (the left side in FIG. 16) of the plurality of resistive films RF2a in the second direction D2. That is, the plurality of resistive films RF2a are located between the plurality of resistive films RF1 and the resistive film RF2b in the second direction D2. The width of the resistive film RF2b is larger than the width of each of the plurality of resistive films RF2a.

In the semiconductor device DEV4, a part of the plurality of resistive films RF3 forms a sixth group, and the other part of the plurality of resistive films RF3 forms a seventh group. The plurality of resistive films RF3 belonging to the sixth group are referred to as a plurality of resistive films RF3a. The resistive film RF3 belonging to the seventh group is referred to as a resistive film RF3b. The resistive film RF3b is located on the other side (the right side in FIG. 16) of the plurality of resistive films RF3a in the second direction D2. That is, the plurality of resistive films RF3a are located between the plurality of resistive films RF1 and the resistive film RF3b in the second direction D2. The width of the resistive film RF3b is larger than the width of each of the plurality of resistive films RF3a.

In the semiconductor device DEV4, the plurality of resistive films RF2a and the plurality of resistive films RF3a are electrically connected with the second circuit group. However, the resistive film RF2b and the resistive film RF3b are not electrically connected with the second circuit group and the other circuits. That is, in the semiconductor device DEV4, a part of the plurality of resistive films RF2 and a part of the plurality of resistive films RF3 are electrically connected with the second circuit group, but the other part of the plurality of resistive films RF2 and the other part of the plurality of resistive films RF3 are dummy resistive films. In these respects, the configuration of the semiconductor device DEV4 is different from the configuration of the semiconductor device DEV1.

In the above example, the number of the resistive films RF2 belonging to the fifth group and the number of the resistive films RF3 belonging to the seventh group are one, but the number of the resistive films RF2 belonging to the fifth group and the number of the resistive films RF3 belonging to the seventh group may be plural.

In the semiconductor device DEV4 as well, the plurality of resistive films RF1 are electrically connected with the first circuit group, and a part of the plurality of resistive films RF2 and a part of the plurality of resistive film RF3 are electrically connected with the second circuit group. Therefore, as in the semiconductor device DEV1, it is possible to suppress an increase in the chip area while suppressing a decrease in the accuracy of the circuits included in the first circuit group. Further, in the semiconductor device DEV4, since the other part of the plurality of resistive films RF2 and the other part of the plurality of resistive films RF3 are not electrically connected with the second circuit group, a decrease in accuracy of the circuits included in the second circuit group can be suppressed.

Fifth Embodiment

A semiconductor device according to the fifth embodiment will be described. The semiconductor device according to the fifth embodiment is a semiconductor device DEV5. Here, differences from the semiconductor device DEV1 will be mainly described, and redundant description will not be repeated.

The semiconductor device DEV5 includes a semiconductor substrate SUB, an interlayer dielectric film ILD1, an interlayer dielectric film ILD2, an interlayer dielectric film ILD3, an interlayer dielectric film ILD4, a wiring WL1, a wiring WL2, a wiring WL3, a wiring WL4, a plurality of resistive films RF1, a plurality of resistive films RF2, a plurality of resistive films RF3, a via plug VP1, a via plug VP2, a via plug VP3, and a via plug VP4. In the semiconductor device DEV5, the plurality of resistive films RF1 are electrically connected with the first circuit group, and the plurality of resistive films RF2 and the plurality of resistive films RF3 are electrically connected with the second circuit group. In these respects, the configuration of the semiconductor device DEV5 is the same as that of the semiconductor device DEV1.

Figure 17:
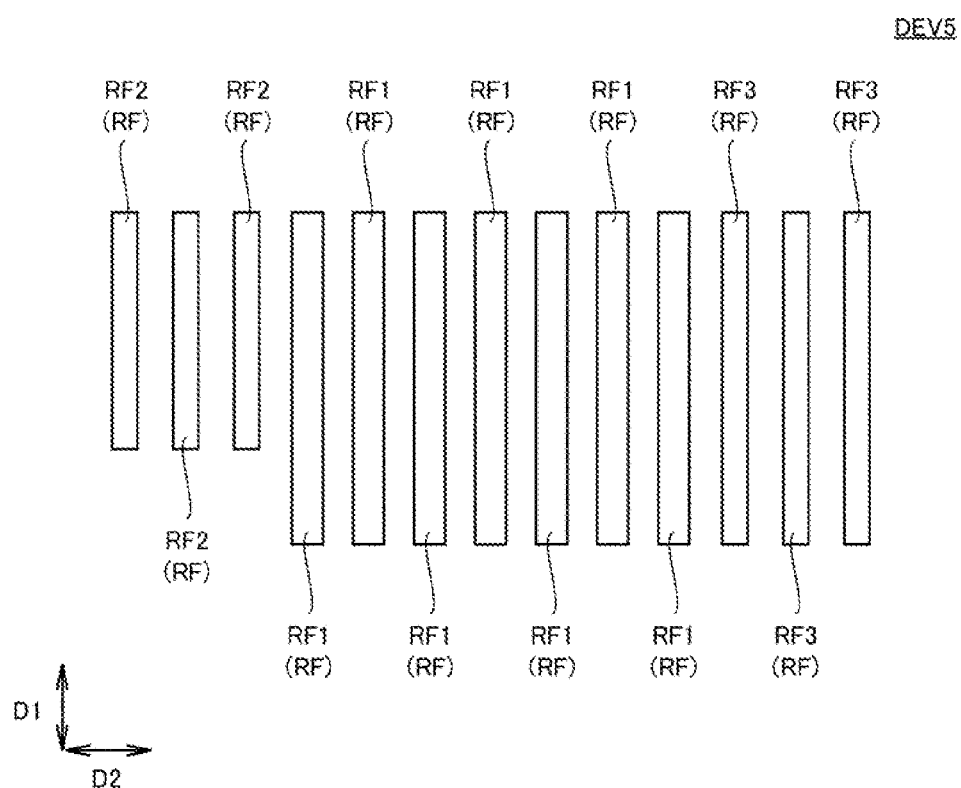
FIG. 17 is a plan view of the resistive film RF in a semiconductor device DEV5.

FIG. 17 is a plan view of the resistive film RF in the semiconductor device DEV5. As shown in FIG. 17, in the semiconductor device DEV5, the length of each of the plurality of resistive films RF2 is shorter than the length of each of the plurality of resistive films RF1. In this regard, the configuration of the semiconductor device DEV5 is different from the configuration of the semiconductor device DEV1.

Even in the semiconductor device DEV5, since the plurality of resistive films RF1 are electrically connected with the first circuit group, and the plurality of resistive films RF2 and the plurality of resistive films RF3 are electrically connected with the second circuit group, it is possible to suppress an increase in the chip area while suppressing a decrease in the accuracy of the circuits included in the first circuit group as in the semiconductor device DEV1. In the semiconductor device DEV5, because the length of each of the plurality of resistive films RF2 can be adjusted according to the type of connected circuit, the flexibility of the layout is improved.

Modified Example

Figure 18:
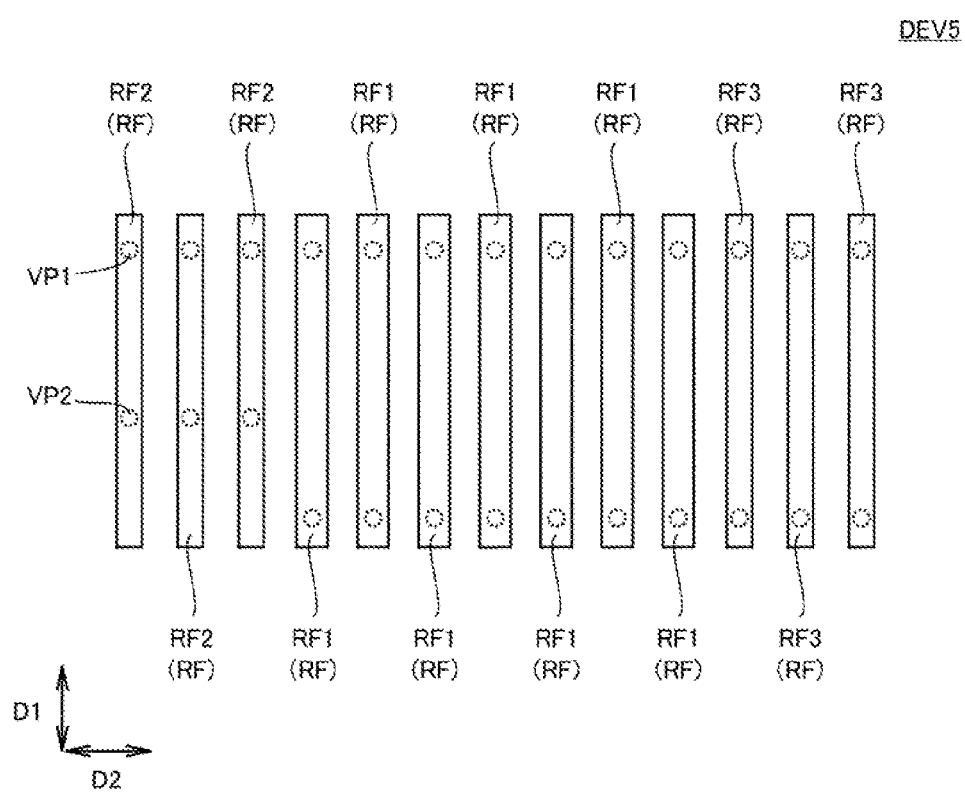
FIG. 18 is a plan view of the resistive film RF in a modified example of the semiconductor device DEV5.

In the above embodiment, the resistance value of each of the plurality of resistive films RF2 is adjusted by adjusting the length of each of the plurality of resistive films RF2. FIG. 18 is a plan view of the resistive film RF in the modified example of the semiconductor device DEV5. As shown in FIG. 18, the resistance value of each of the plurality of resistive films RF2 may be adjusted by adjusting the distance between the via plug VP1 and the via plug VP2. More specifically, the distance between the via plug VP1 and the via plug VP2 electrically connected with the resistive film RF2 in the first direction D1 may be shorter than the distance between the via plug VP1 and the via plug VP2 electrically connected with the resistive film RF1 in the first direction D1.

Although the invention made by the present inventors has been described in detail based on the embodiments, it is needless to say that the present invention is not limited to the above-described embodiments and can be variously modified without departing from the gist thereof.

What is claimed is:

1. A semiconductor device comprising:

an interlayer dielectric film; and a plurality of resistive films arranged on the interlayer dielectric film, wherein each of the plurality of resistive films extends in a first direction along an upper surface of the interlayer dielectric film in plan view, wherein the plurality of resistive films are arranged spaced apart in a second direction along the upper surface of the interlayer dielectric film and orthogonal to the first direction in plan view, wherein the plurality of resistive films are divided into a first group, a second group and a third group, wherein the first group is located between the second group and the third group in the second direction, wherein a second width variation amount of each of a plurality of second resistive films belonging to the second group and a third width variation amount of each of a plurality of third resistive films belonging to the third group are greater than a first width variation amount of each of a plurality of first resistive films belonging to the first group, wherein the first width variation amount is a difference between a reference width and a width of each of the plurality of first resistive films, wherein the second width variation amount is a difference between the reference width and a width of each of the plurality of second resistive films, wherein the third width variation amount is a difference between the reference width and a width of each of the plurality of third resistive films, wherein the reference width is a width of one of the plurality of resistive films at the center in the second direction, wherein the plurality of first resistive films are electrically connected with a first circuit group, wherein at least part of the plurality of second resistive films and/or at least part of the plurality of third resistive films are electrically connected with a second circuit group different from the first circuit group.

2. The semiconductor device according to claim 1, wherein the plurality of second resistive films and the plurality of third resistive films are electrically connected with the second circuit group.

3. The semiconductor device according to claim 2, wherein the width of each of the plurality of second resistive films and the width of each of the plurality of third resistive films are smaller than the reference width.

4. The semiconductor device according to claim 3, wherein, in the first direction, a length of each of the plurality of second resistive films is shorter than a length of each of the plurality of first resistive films.

5. The semiconductor device according to claim 2, wherein the width of each of the plurality of second resistive films and the width of each of the plurality of third resistive films are larger than the reference width.

6. The semiconductor device according to claim 2, wherein the width of each of the plurality of second resistive films is smaller as a distance from the first group is larger in the second direction, wherein a difference between the widths of two next to each other among the plurality of second resistive films is larger as a distance from the first group is larger in the second direction, wherein the width of each of the plurality of third resistive films is smaller as a distance from the first group is larger in the second direction, and wherein a difference between the widths of two next to each other among the plurality of third resistive films is larger as a distance from the first group is larger in the second direction.

7. The semiconductor device according to claim 1, wherein a part of the plurality of second resistive films and a part of the plurality of third resistive films are electrically connected with the second circuit group, and wherein the other part of the plurality of second resistive films and the other part of the plurality of third resistive films are dummy resistive films.

8. The semiconductor device according to claim 7, wherein the other part of the plurality of second resistive films is farther from the first group than the part of the plurality of second resistive films in the second direction, wherein the other part of the plurality of third resistive films is farther from the first group than the part of the plurality of third resistive films in the second direction, wherein the width of each of the part of the plurality of second resistive films and the width of each of the part of the plurality of third resistive films are smaller than the reference width, wherein the width of each of the other part of the plurality of second resistive films is larger than the width of each of the part of the plurality of second resistive films, and wherein the width of each of the other part of the plurality of third resistive films is larger than the width of each of the part of the plurality of third resistive films.

9. The semiconductor device according to claim 1, wherein each of the plurality of resistive films is formed of a material including one selected from the group consisting of silicon chromium, carbon-doped silicon chromium, nickel chromium, titanium nitride and tantalum nitride.

10. The semiconductor device according to claim 1, wherein the first circuit group includes at least one of an analog/digital converter circuit, a digital/analog converter circuit, a bandgap reference circuit, a high frequency circuit and an amplifier circuit, and wherein the second circuit group includes at least one of a circuit in which calibration is performed and a circuit generating a voltage from a power supply voltage.

* * * * *